United States Patent
Liu et al.

(10) Patent No.: US 8,013,372 B2
(45) Date of Patent: Sep. 6, 2011

(54) INTEGRATED CIRCUIT INCLUDING A STRESSED DIELECTRIC LAYER WITH STABLE STRESS

(75) Inventors: Huang Liu, Singapore (SG); Jeff Shu, Singapore (SG); Luona Goh, Singapore (SG); Wei Lu, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 610 days.

(21) Appl. No.: 12/062,535

(22) Filed: Apr. 4, 2008

(65) Prior Publication Data

US 2009/0250764 A1    Oct. 8, 2009

(51) Int. Cl.
*H01L 21/336* (2006.01)
(52) U.S. Cl. ........ 257/296; 438/207; 438/405; 438/424; 438/433; 257/E21.546
(58) Field of Classification Search .................. 438/207, 438/296, 405, 424, 433; 257/E21.546
See application file for complete search history.

(56) References Cited

U.S. PATENT DOCUMENTS

| | | | |
|---|---|---|---|
| 6,207,532 B1 * | 3/2001 | Lin et al. | 438/424 |
| 6,239,002 B1 * | 5/2001 | Jang et al. | 438/435 |
| 6,251,746 B1 * | 6/2001 | Hong et al. | 438/424 |
| 6,326,282 B1 * | 12/2001 | Park et al. | 438/424 |
| 6,602,806 B1 | 8/2003 | Xia et al. | |
| 6,939,725 B2 | 9/2005 | Kutsunai et al. | |
| 2005/0255667 A1 * | 11/2005 | Arghavani et al. | 438/405 |
| 2006/0027876 A1 * | 2/2006 | Jung et al. | 257/369 |
| 2009/0236667 A1 * | 9/2009 | Schwan et al. | 257/374 |

* cited by examiner

*Primary Examiner* — Andy Huynh
(74) *Attorney, Agent, or Firm* — Horizon IP Pte. Ltd.

(57) ABSTRACT

A method for fabricating an integrated circuit is provided. The method includes providing a substrate having an active region and an opening in the substrate adjacent to the active region. The opening is filled with a dielectric material so as to provide an isolation region in the substrate. A transistor is also formed in the active region and a pre-metal dielectric layer formed over the substrate and transistor. At least one of the dielectric layer in isolation region or the pre-metal dielectric layer includes a stressed $O_3$ TEOS oxide having a stress retaining dopant, wherein the concentration of the stress retaining dopant is sufficient to retard stress degradation of the $O_3$ TEOS oxide.

9 Claims, 8 Drawing Sheets

INTEGRATED CIRCUIT INCLUDING A STRESSED DIELECTRIC LAYER WITH STABLE STRESS

FIELD OF THE INVENTION

The present invention relates generally to integrated circuits (ICs), and more particularly to forming stressed dielectric layers in ICs.

BACKGROUND OF THE INVENTION

Integrated circuits (ICs) typically comprise numerous circuit components interconnected to perform the desired functions. Such circuit components include, for example, transistors such as field effect transistors (FETs). Dielectric materials have been employed to generate strain in the channel region of the transistor to enhance carrier mobility. For example, tensile stress may be applied to the channel region of n-type FETs to enhance carrier mobility. In the case of p-type FETs, compressive stress may be applied to the channel region.

It is desirable to provide enhanced strain generation in channel regions of transistors to enhance carrier mobility.

SUMMARY OF THE INVENTION

The present invention relates to forming stressed dielectric layers in ICs. In one aspect of the invention, an IC comprises a substrate having active and isolation regions. A transistor having a channel region is disposed on the substrate in the active region. In one embodiment, the isolation region comprises $O_3$ TEOS oxide having a stress retaining dopant, wherein the $O_3$ TEOS oxide induces a first stress in the channel region of the transistor. In another embodiment, the IC further comprises a dielectric layer disposed on the substrate and the transistor. At least one of the isolation region or the dielectric layer comprises $O_3$ TEOS having a stress retaining dopant, the $O_3$ TEOS oxide inducing a first stress in the channel region of the transistor.

In another aspect of the invention, a method of fabricating an IC comprises providing a substrate having an active region and an opening in the substrate adjacent to the active region. In one embodiment, the opening is filled with $O_3$ TEOS oxide having a stress retaining dopant to form an isolation region in the substrate, and a transistor is formed on the substrate in the active region. In another embodiment, the opening is filled with a first dielectric material to form an isolation region in the substrate. A transistor is formed on the substrate in the active region. A pre-metal dielectric (PMD) layer is formed on the substrate and the transistor, wherein the PMD layer comprises a second dielectric material. At least one of the first or second dielectric materials comprises $O_3$ TEOS oxide having a stress retaining dopant.

These and other objects, along with advantages and feature of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which.

DETAILED DESCRIPTION OF THE INVENTION

The present invention relates to ICs. More particularly, the present invention relates to stressed dielectric layers for strain generation in, for example, channel region of a transistor. The invention can be applied to various types of ICs, such as memory devices including dynamic random access memories (DRAMs), static random access memories (SRAMs), non-volatile memories including programmable read-only memories (PROM) and flash memories, optoelectronic devices, logic devices, communication devices, digital signal processors (DSPs), microcontrollers, system-on-chip, as well as other types of devices.

Figure 1:
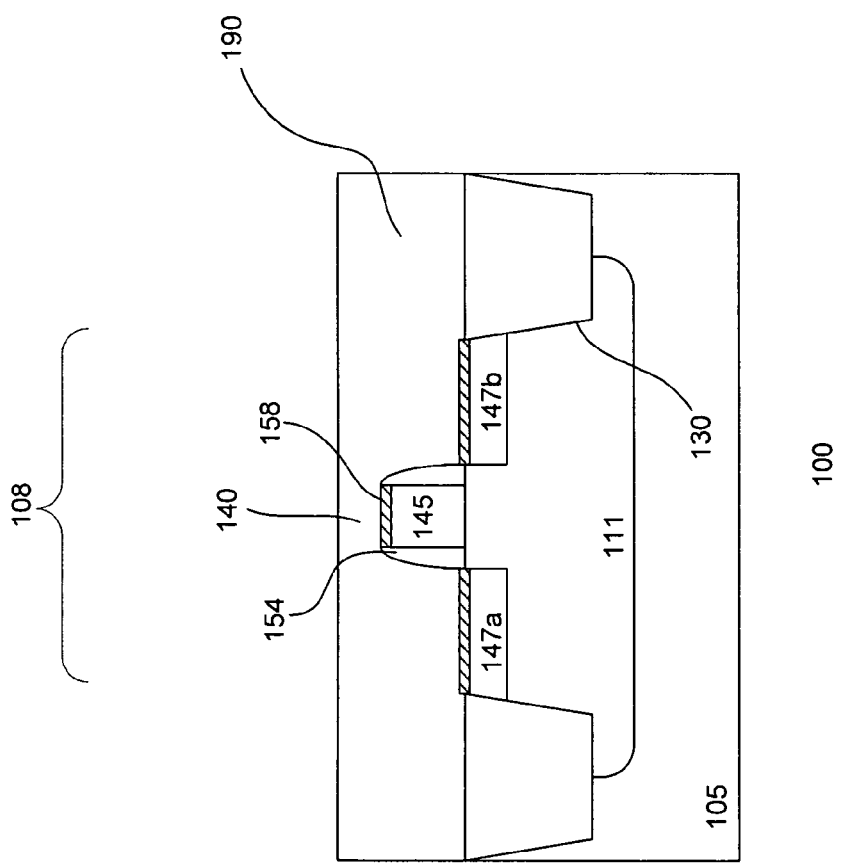
FIG. 1 shows a cross-section of portion of an IC in accordance with one embodiment of the invention.

FIG. 1 shows a cross-sectional view of a portion of an IC 100 in accordance with one embodiment of the invention. The IC comprises a substrate 105. The substrate comprises a semiconductor material, such as silicon. Other types of semiconductor substrates are also useful. Defined on the substrate is an active region 108. The active region includes a doped well 111 of a first charge carrier type. In one embodiment, the first charge carrier type comprises p-type. For example, the doped well comprises p-type dopants such as boron (B), aluminum (Al) or a combination thereof.

A transistor 140 is disposed in the active region. The transistor, for example, comprises a FET. The FET comprises a second charge carrier type. In one embodiment, the second charge carrier type comprises n-type. The transistor includes a gate stack 145. The gate stack can be gate conductor which forms a plurality of transistors having a common gate. The gate stack comprises a gate electrode over a gate dielectric. The gate electrode, for example, comprises polysilicon while the gate dielectric comprises silicon oxide. Other types of gate electrode and gate dielectric materials are also useful. Dielectric spacers 154 are typically provided on sidewalls of the gate stack. First and second diffusion regions 147a-b are provided adjacent to the gate stack. The diffusion regions comprise second type or n-type dopants, such as phosphorous (P), arsenic (As), antimony (Sb) or a combination thereof. Silicide contacts 158 can be provided on the top of the gate and diffusion regions to reduce sheet resistance.

Isolation regions 130 are provided to isolate the active region from other device regions. In one embodiment, the isolation regions comprise shallow trench isolations (STIs). STIs comprise trenches formed in the substrate and filled with a dielectric material. The depth of the STIs is generally about 1500-4500 Å. Other depths are also useful. The doped well typically overlaps the bottom of the STIs. A pre-metal dielectric (PMD) layer 190 is provided over the transistor. The PMD layer comprises a dielectric material. Optionally, a stress liner layer (not shown) can be provided over the transistor below the PMD layer. The stress liner applies a tensile stress on the channel region of the n-type transistor.

In accordance with one embodiment of the invention, the dielectric material of the STI and/or PMD induces a first stress. For example, either the STI trenches, PMD layer, or both, comprise a material which induces the first stress. In one embodiment, the first stress comprises tensile stress. The dielectric material, in a preferred embodiment, comprises an ozone-tetraethoxysilane ($O_3$-TEOS) oxide with a stress retaining dopant. The stress retaining dopant, in one embodiment, comprises nitrogen (N). Other types of dopants are also useful. Doping the $O_3$-TEOS oxide with N enhances its resistance to moisture absorption. This is because the N dopants react with Si in the $O_3$-TEOS oxide to form stable Si—N bonds, thereby preventing the Si from reacting with atmospheric moisture (to form the less stable Si—OH bonds). As moisture can lead to stress degradation in the $O_3$-TEOS oxide, providing N dopants enhances the ability of the $O_3$-TEOS oxide to retain its stress.

The dopant concentration of N should be sufficient to retard stress degradation of the silicon oxide film. In one embodiment, the N concentration in the $O_3$-TEOS oxide is about 1E6-1E15 c/s (using Secondary Ion Mass Spectrometry (SIMS) measurement). Other concentrations are also useful. In general, the higher the N concentration in the $O_3$-TEOS, the higher its resistance to moisture absorption, thus forms more stable stress.

In one embodiment, the N doped $O_3$-TEOS oxide comprises an in-situ N doped $O_3$-TEOS oxide. For example, precursors for forming the dielectric material include $O_3$, TEOS and a N source. The N source, in one embodiment, can be selected from $NH_3$, $N_2O$ or a combination thereof. Other types of N sources are also useful.

Figure 2A:
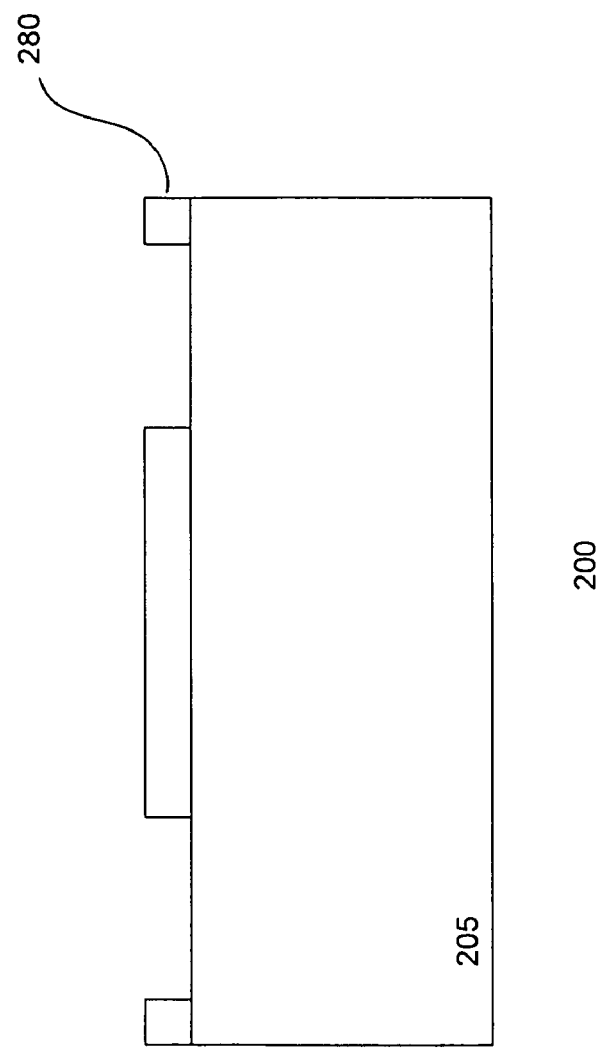
FIGS. 2a-f show a process for forming an IC in accordance with one embodiment of the invention.

FIGS. 2a-f show a process for forming an IC 200 in accordance with one embodiment of the invention. Referring to FIG. 2a, a substrate 205 is provided. The substrate, in one embodiment, comprises a p-type silicon substrate. Other types of substrates, such as a germanium-based, gallium arsenide, silicon-on-insulator (SOI), or sapphire substrate, are also useful.

A mask 280 is formed on the surface of the substrate. The mask is patterned to form openings corresponding to locations where STI trenches are to be formed. The mask, for example, comprises a soft mask such as photoresist. The photoresist can be patterned by conventional lithographic techniques. An antireflective coating (ARC) is typically provided beneath the photoresist.

Preferably, the mask comprises a hard mask and a soft mask. The hard mask can include a pad oxide layer under a silicon nitride layer. Other types of hard masks are also useful. An ARC can be disposed between the hard mask and soft mask. The soft mask is patterned using conventional lithographical techniques to form openings. The soft mask is then used to pattern the hard mask using, for example, an anisotropic etch such as reactive ion etch (RIE). The soft mask can be removed after patterning the hard mask.

Figure 2B:
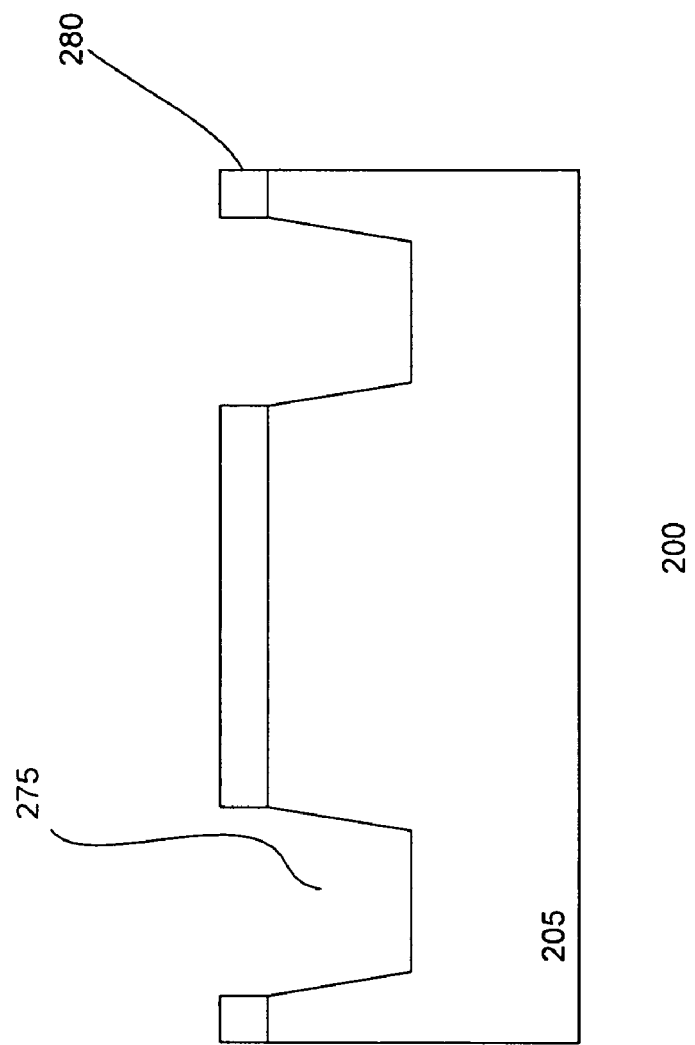

Referring to FIG. 2b, the substrate is etched to form trenches 275 in regions unprotected by the mask. The trenches are etched using, for example, RIE. Other processes for forming the trenches are also useful. Typically, the depth of the trenches is about 1500-4500 Å. Other depths are also useful and may depend on design requirements.

Figure 2C:
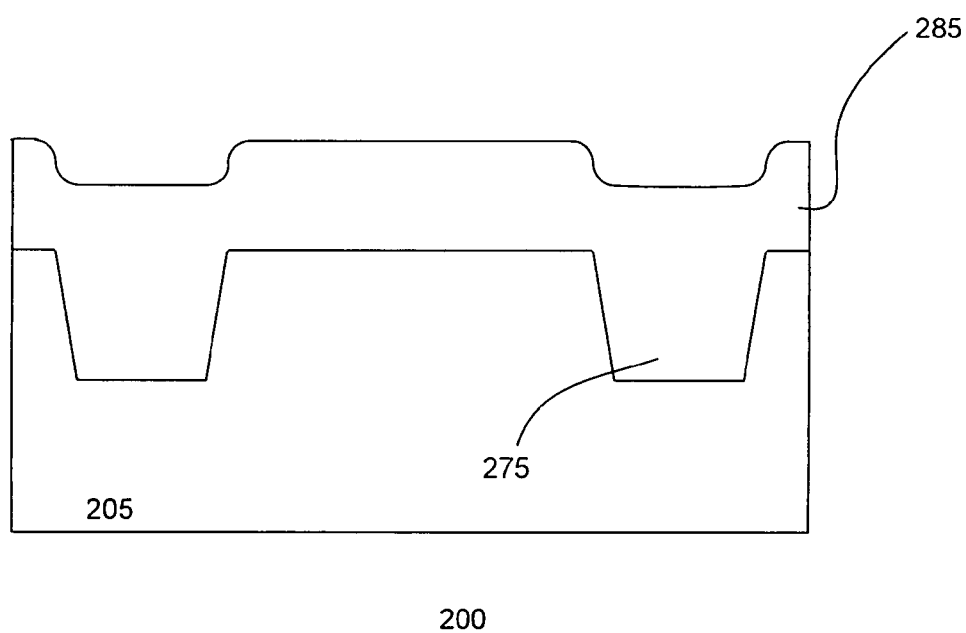

Referring to FIG. 2c, a dielectric layer 285 is deposited on the substrate to fill the trenches. The dielectric layer is sufficiently thick to ensure complete filling of the trenches. A dielectric liner layer can be formed to line the substrate and trenches prior to depositing the dielectric layer. The liner layer removes residual damage created during the etch process and provides corner rounding.

The dielectric layer, in one embodiment, comprises a dielectric material which applies a first stress. The dielectric material, in one embodiment, applies a tensile stress. Preferably, the dielectric material comprises $O_3$-TEOS doped with a stress retaining dopant. Other types of dielectric materials are also useful. The stress retaining dopant, in one embodiment, comprises N. The concentration of N should be sufficient to retard stress degradation of the silicon oxide film. The N concentration in the $O_3$-TEOS oxide is, for example, about 1E6-1E15 c/s (using SIMS measurement). Other N concentrations are also useful. In general, the higher the N concentration in the $O_3$-TEOS, the higher its resistance to moisture absorption, thus forms more stable stress.

Chemical vapor deposition (CVD) process is used to form the $O_3$-TEOS oxide. In one embodiment, the $O_3$-TEOS oxide is formed by sub-atmospheric CVD (SACVD) process. The $O_3$-TEOS oxide, in one embodiment, is in-situ doped with N. To form the N doped $O_3$-TEOS oxide, gaseous precursors including $O_3$, TEOS, TEOS carrier gas, and a nitrogen source are provided in the deposition chamber. The nitrogen source, in one embodiment, comprises $NH_3$, $N_2O$, or both. Other nitrogen-containing species such as $N_2$, $NO_2$, $NCl_3$, $NF_3$, $I_3N$ and $N_2O_3$ are also useful. The carrier gas can comprise, for example, He, $N_2$, Ar, or any other useful inert gas.

In one embodiment, the N doped $O_3$-TEOS oxide is deposited at a temperature of about 350-600° C. Preferably, the deposition temperature is about 400-550° C. The deposition pressure is about 50-600 Torr, and preferably about 100-500 Torr. The TEOS flow rate is about 1000 sccm-30000 sccm. Preferably, the TEOS flow rate is about 3000-25000 sccm. The TEOS carrier gas flow rate is about 1000-50000 sccm and preferably about 3000-30000 sccm. The $O_3$ flow rate is about 5000-40000 sccm. Preferably, the $O_3$ flow rate is about 10000-35000 sccm. In one embodiment, the concentration of $O_3$ is about 5-20% and preferably about 10-15%. As for nitrogen source, the flow rate is about 200-5000 sccm and preferably about 500-3000 sccm.

Figure 2D:
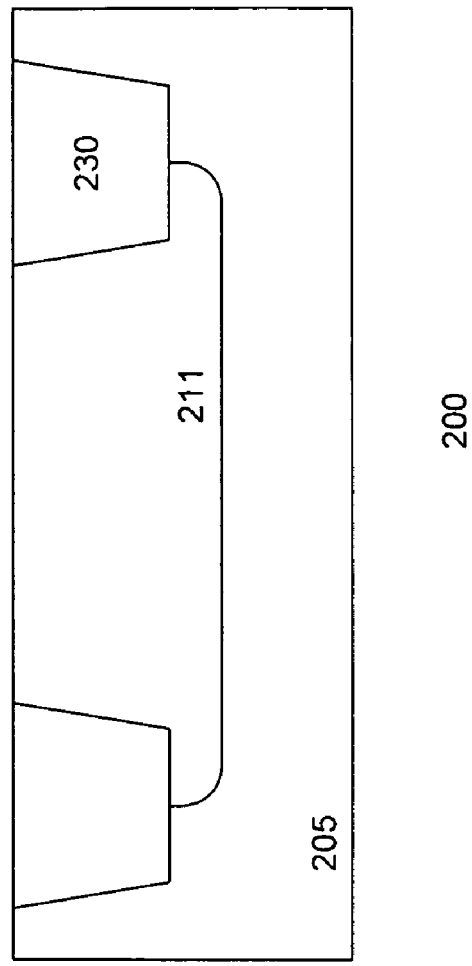

Referring to FIG. 2d, excess dielectric material is removed. In one embodiment, the excess dielectric material is removed by, for example, chemical mechanical polishing (CMP). Other processes for removing excess dielectric materials are also useful. The CMP removes the excess dielectric material and form a planar substrate surface, forming STIs 230. Typically, a polish stop layer is provided on the substrate surface. The polish stop layer, for example, comprises silicon nitride or a material which the dielectric layer can be polished selective thereto. The polish stop layer can be the hard mask layer used to form the trenches.

A doped well 211 is formed after the STIs are formed. The doped well comprises first type dopants. In one embodiment, the first type dopants comprise p-type dopants which forms a p-type doped well. The p-type dopants can include, for example, B. Typically, the dopant concentration of the doped well is about $1E10-1E14/cm^2$. Conventional ion implantation techniques, such as implantation with a mask can be used to form the doped well. Other techniques are also useful. Optionally, the doped well can be formed prior to forming the STIs.

Figure 2E:
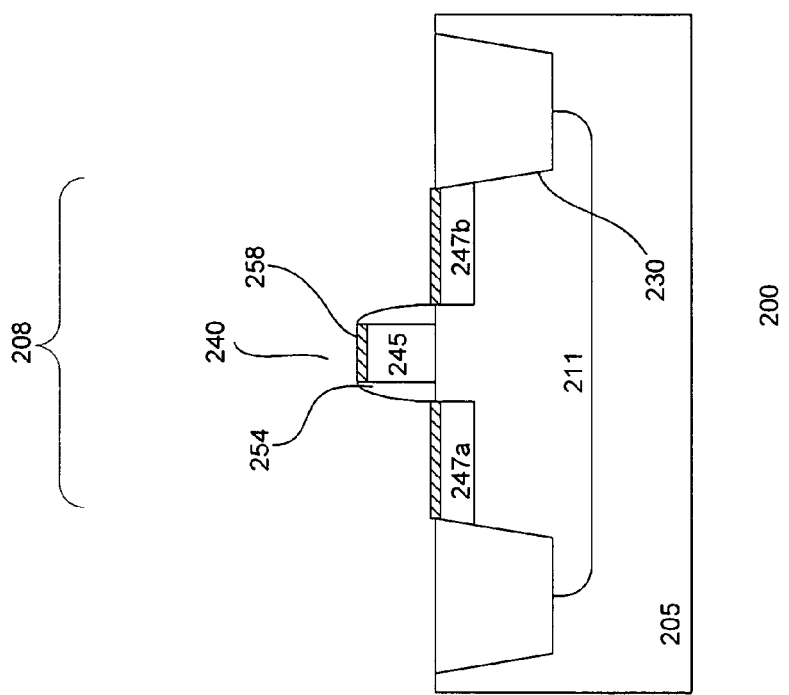

Referring to FIG. 2e, the process continues to form a transistor 240 in the active region 208 defined by the STIs. To form the transistor, gate stack layers are formed on the substrate. The gate stack layers generally comprise a polysilicon gate electrode layer over a thermal oxide gate dielectric layer. Other types of gate stack layers are also useful. The gate layers are patterned using conventional mask and etch techniques to form a gate stack 245. The gate stack can be a gate conductor which is a common gate for a plurality of transistors.

Source/drain diffusion regions 247a-b are then formed in the active region of the substrate adjacent to the gate. In one embodiment, the source/drain diffusion region comprises dopants of second carrier type. For example, the source/drain diffusion region comprises n-type dopants to form n-type transistor. The n-type diffusion regions are formed by implanting n-type dopants, such as P, As, Sb or a combination thereof.

Dielectric spacers 254 are formed on the sidewalls of the gate stack. The dielectric spacers, for example, comprise silicon nitride. Other types of dielectric materials are also useful to form the spacers. To form the spacers, a spacer layer is deposited on the substrate which covers the gate and substrate surface. An etch removes the horizontal components of the spacer layer, leaving spacers on the sidewalls of the gate stack.

The diffusion regions can include shallow source/drain extensions (not shown) and deep source/drain portions. The source/drain extensions can be formed before the formation of sidewall spacers while the deep source/drain portions are formed after the spacers are formed. Metal silicide contacts 258 can be formed on the gate and diffusion regions. The metal silicide contacts, for example, comprise nickel silicide contacts. Other types of metal silicide contacts are also useful. To form the metal silicide contacts, a metal layer is formed on the substrate and annealed to cause a reaction with the silicon substrate. Unreacted metal are removed, leaving the silicide contacts.

Figure 2F:
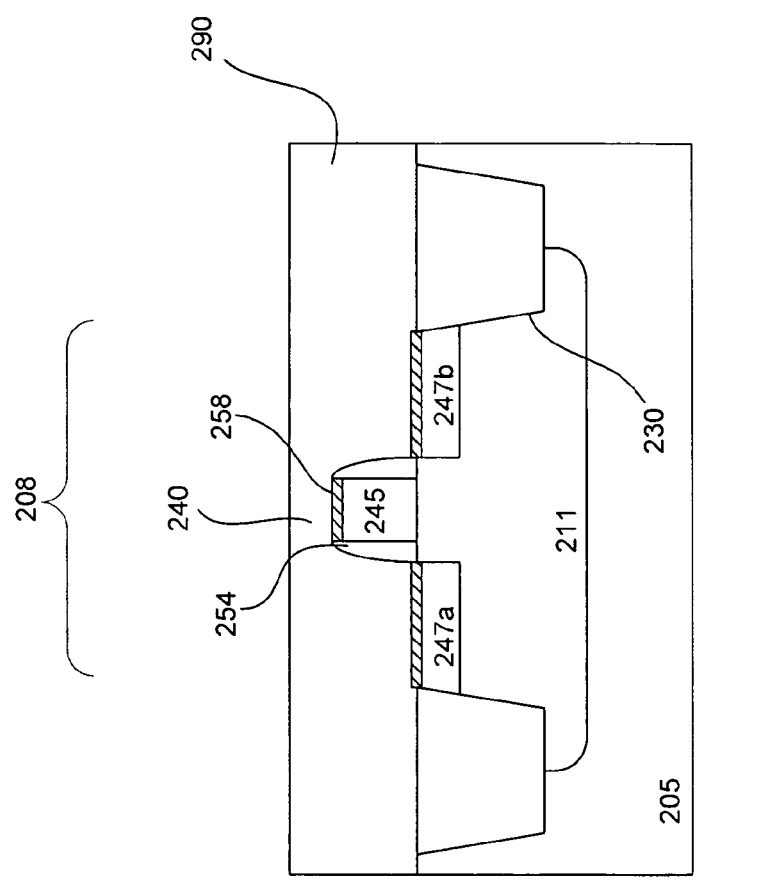

In FIG. 2f, a PMD layer 290 is formed on the substrate. In one embodiment, prior to forming the PMD layer, a dielectric stress inducing liner layer (not shown) can be formed on the substrate. The liner conformally lines the substrate and transistor and applies a first stress on the channel region of the transistor beneath the gate. The first stress, for example, comprises a tensile stress for a n-type transistor. The stress liner, in one embodiment, comprises silicon nitride.

The PMD layer covers the substrate and transistor. The PMD layer can be planarized by, for example, CMP. Other methods for planarizing the PMD layer are also useful. In one embodiment, the PMD layer applies the first stress. Preferably, the dielectric material comprises $O_3$-TEOS doped with a stress retaining dopant, as previously described. Other types of dielectric materials are also useful. The stress retaining dopant, in one embodiment, comprises N.

The process continues by forming interconnections to the contacts of the transistors. For example, the PMD layer is patterned to create contact holes. The contact holes are then filled with conductive material, such as tungsten, to form interconnects. Additional processes are performed to complete the IC, for example, additional interconnect levels, final passivation, dicing, and packaging.

Providing a high tensile PMD layer increases electron mobility, leading to improved nFET performance. Alternatively, a compressive layer can be used to enhance hole mobility and pFET performance. As described, introducing dopants into the high tensile silicon oxide film, according to one embodiment of the invention, retards moisture absorption of the film to prevent degradation of its tensile stress characteristics.

The process continues to complete fabricating the IC. For example, the process continues to form interconnects, additional interconnect levels, passivation layer, dicing, assembly and packaging.

Figure 3:
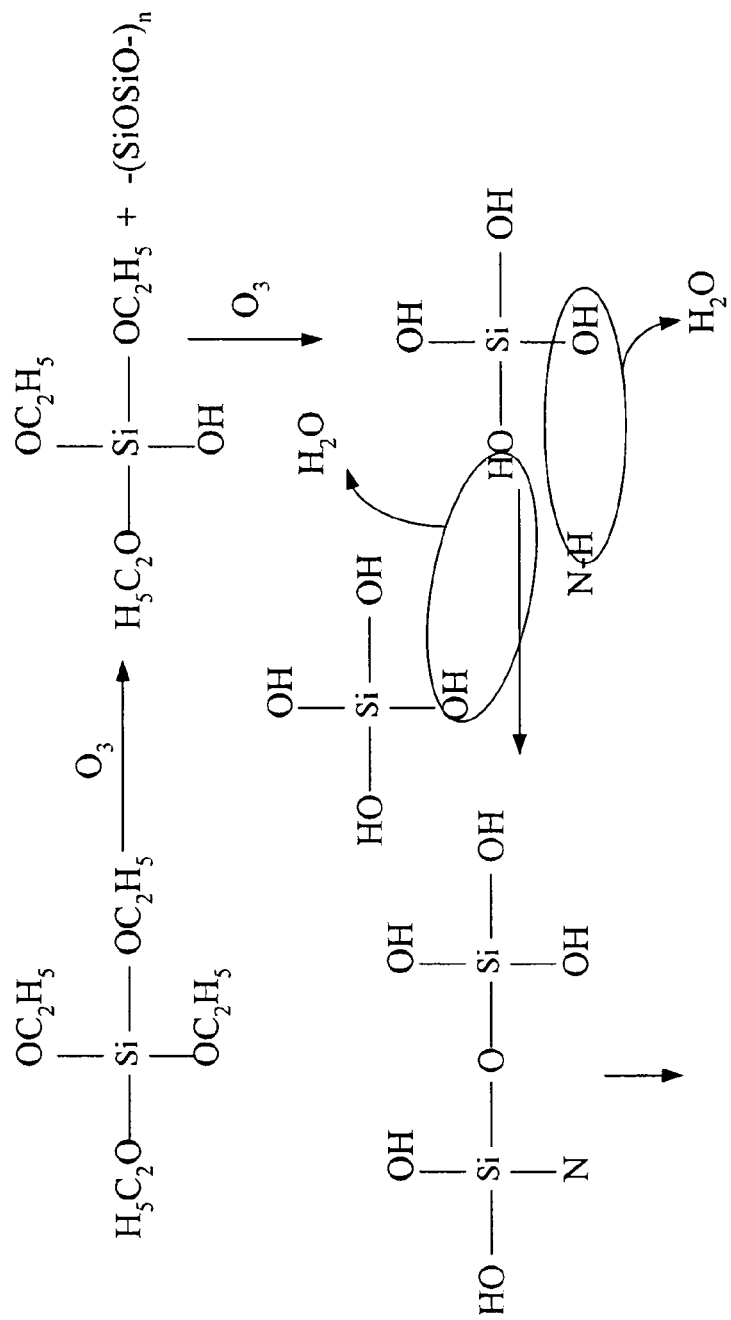
FIG. 3 shows the chemical reactions that occur during a chemical vapor deposition (CVD) process to form a N doped $O_3$-TEOS oxide film, in accordance with one embodiment of the invention.

FIG. 3 shows the chemical reactions that occur during the CVD process to form the N-doped high tensile $O_3$-TEOS oxide film. First, $O_3$ and TEOS react to form silanol $(Si(OH)_4)$. Some of the hydroxyl (OH) groups in the silanol are replaced by nitrogen (N) derived from the nitrogen source, forming N doped silanol. Thereafter, N doped $O_3$-TEOS oxide is formed from condensation between N doped silanol molecules. By replacing OH groups with N atoms, there are less number of OH groups. This reduces the potential for OH groups to bond with O atoms from $O_3$ to form $H_2O$ (or water) molecules. As a result, the N doped $O_3$-TEOS has improved resistance against moisture absorption, which can degrade the stress retention of the layer.

As described, the doped $O_3$-TEOS oxide applies a tensile stress to the channel of n-type transistors to enhance carrier mobility of electrons. The doped $O_3$-TEOS oxide can be used to form STIs and/or PMD. We have also found that the tensile doped $O_3$-TEOS oxide can be used on p-type transistors without adversely affecting their performance. The p-type transistors may be narrow-width or wide-width p-type transistors. Therefore, the doped $O_3$-TEOS oxide can advantageously be used for both n-type and p-type transistors.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating an integrated circuit (IC) comprising:
   providing a substrate having an active region and an opening in the substrate adjacent to the active region;
   filling the opening with a first stress layer of $O_3$ TEOS oxide having a stress retaining dopant to form an isolation region in the substrate, the concentration of stress retaining dopant being sufficient to retard stress degradation of the first stress layer of $O_3$ TEOS oxide; and
   forming a transistor on the substrate in the active region.

2. The method of claim 1 wherein the stress retaining dopant comprises nitrogen.

3. The method of claim 2 wherein the nitrogen comprises a concentration of about 1E6-1E15 c/s.

4. The method of claim 1 wherein the $O_3$ TEOS oxide is in-situ doped with nitrogen to form N doped $O_3$ TEOS oxide.

5. The method of claim 4 wherein N doped $O_3$ TEOS oxide is formed by chemical vapor deposition.

6. The method of claim 5 wherein the N doped $O_3$ TEOS oxide is deposited at a temperature of about 350-600° C. and pressure of about 50-600 Torr.

7. A method of fabricating an integrated circuit (IC) comprising:
   providing a substrate having an active region and an opening in the substrate adjacent to the active region;
   filling the opening with a first dielectric material to form an isolation region in the substrate;
   forming a transistor on the substrate in the active region; and forming a pre-metal dielectric (PMD) layer on the substrate and the transistor, the PMD layer comprises a second dielectric material, wherein at least one of the first or second dielectric materials comprises a stressed $O_3$ TEOS oxide layer having a stress retaining dopant, the concentration of stress retaining dopant being sufficient to retard stress degradation of the stressed $O_3$ TEOS oxide layer.

8. The method of claim 7 wherein the stress retaining dopant comprises nitrogen.

9. The method of claim 7 further comprises providing a dielectric stress inducing liner layer on the substrate and transistor prior to forming the PMD layer.

* * * * *